(12) United States Patent
Feder et al.

(10) Patent No.: US 9,015,402 B2
(45) Date of Patent: Apr. 21, 2015

(54) MEMORY CONTROLLER AND A METHOD FOR WRITING INFORMATION TO A K-LEVEL MEMORY UNIT

(76) Inventors: Meir Feder, Herzelia (IL); Ofer Shayevitz, Rishon Lezion (IL)

( * ) Notice: Subject to any disclaimer, the term of this patent is extended or adjusted under 35 U.S.C. 154(b) by 851 days.

(21) Appl. No.: 13/142,049

(22) PCT Filed: Dec. 24, 2009

(86) PCT No.: PCT/IL2009/001215
§ 371 (c)(1),
(2), (4) Date: Jul. 18, 2011

(87) PCT Pub. No.: WO2010/073250
PCT Pub. Date: Jul. 1, 2010

(65) Prior Publication Data
US 2011/0289286 A1    Nov. 24, 2011

Related U.S. Application Data

(60) Provisional application No. 61/140,627, filed on Dec. 24, 2008.

(51) Int. Cl.
*G06F 12/00* (2006.01)
*G11C 11/56* (2006.01)
*G11C 27/00* (2006.01)

(52) U.S. Cl.
CPC ............ *G11C 11/56* (2013.01); *G11C 11/5628* (2013.01); *G11C 11/5642* (2013.01); *G11C 27/005* (2013.01); *G11C 2211/5647* (2013.01)

(58) Field of Classification Search
CPC ..................... G06F 12/0238; G06F 3/0679
USPC ................. 711/100, 103, 154, 200
See application file for complete search history.

(56) References Cited

U.S. PATENT DOCUMENTS

| | | | |
|---|---|---|---|
| 5,327,196 A | 7/1994 | Kato et al. | |
| 6,650,774 B1 | 11/2003 | Szeliski | |
| 7,164,601 B2 * | 1/2007 | Mitani et al. | 365/185.03 |
| 7,254,071 B2 | 8/2007 | Tu et al. | |
| 8,259,497 B2 * | 9/2012 | Shalvi et al. | 365/185.09 |
| 2002/0136044 A1 * | 9/2002 | Werner et al. | 365/45 |
| 2006/0291291 A1 * | 12/2006 | Hosono et al. | 365/185.22 |
| 2007/0024634 A1 | 2/2007 | Speigle et al. | |
| 2007/0052859 A1 | 3/2007 | Gobert et al. | |
| 2009/0043951 A1 * | 2/2009 | Shalvi et al. | 711/103 |
| 2011/0289286 A1 * | 11/2011 | Feder et al. | 711/154 |

OTHER PUBLICATIONS

International Search Report issued on May 14, 2010, for International Patent Application No. PCT/IL2009/001215.

* cited by examiner

*Primary Examiner* — Tuan Thai
(74) *Attorney, Agent, or Firm* — Pearl Cohen Zedek Latzer Baratz LLP

(57) ABSTRACT

A method, a computer readable medium and a memory controller. The method for writing information to a K-level memory unit, includes: receiving a sequence of information bits; generating an information value that represents the sequence of information bits; applying a first function to the information value, to provide a first function result; selecting a first cell of the K-level memory unit as a current cell; wherein K is a positive integer that is greater than 1; writing the first function result to the first cell; and repeating the stages of: (a) reading a current cell to provide a current read result; (b) applying a second function to the current read result and to a function result that was written to the current cell, to provide a second function result; (c) selecting another cell as a current cell; and (d) writing the second function result to the current cell.

11 Claims, 6 Drawing Sheets

501 selecting an input distribution in response to the memory unit writing law 502 updating an inversed memory unit writing law, wherein the updating includes repeating the stages of: (i) writing an estimation input to a selected cell, (ii) reading the selected cell to provide a reading result, and (iii) storing a writing operation result that is responsive to the estimation input and to the reading result; and updating the inversed memory unit writing law in response to the writing operation results 503 determining M so that a ratio between a number of bits of the sequence of information bits to M approximates a mutual information

FIG. 2B 570 retrieving reading results from cells selected according to the cells selection rule > 571 reading a current cell to provide a reading result of the current cell > 572 applying of a third function to: (i) the reading result of the current cell, (ii) a previous intermediate derived result, and (iii) the memory unit writing law, for determining a current intermediate derived result > 573 selecting another cell as a current cell in response to the cells selection rule 580 determining a derived sequence of information bits in response to multiple reading results

FIG. 2C 610 repeating the stages of:

611 reading a current cell to provide a reading result of the current cell 612 applying a third function that is responsive to the reading result of the current cell for determining a current intermediate derived result 6121 applying the third function to: (i) the reading result of the current cell, (ii) a previous intermediate derived result, and (iii) the memory unit writing law, for determining a current intermediate derived result 613 selecting another cell as a current cell in response to the cells selection rule 620 determining a derived sequence of information bits in response to the last intermediate derived result

MEMORY CONTROLLER AND A METHOD FOR WRITING INFORMATION TO A K-LEVEL MEMORY UNIT

CROSS REFERENCE TO RELATED APPLICATIONS

This application claims the benefit of U.S. Provisional Patent Application Ser. No. 61/140,627, filed on Dec. 24, 2008 and entitled "METHOD AND SYSTEM FOR MULTI-LEVEL MEMORY", which is incorporated in its entirety herein by reference.

BACKGROUND OF THE INVENTION

Flash memory is a huge industry that constantly seeks better techniques for higher capacity and efficient I/O. There are several manufacturers (Toshiba, Samsung and others), and several companies that provide technology for these devices—Sandisk, Spansion, Samsung, Toshiba and others. The market is estimated by Billions of dollars per year.

Flash memories technology have faced the introduction of Multi-level cells (MLC). An MLC is a memory element capable of storing more than a single bit of information. MLC NAND flash is a flash memory technology using multiple levels per cell to allow more bits to be stored as opposed to SLC NAND flash technologies, which uses a single level per cell. This reduces the amount of margin separating the states and results in the possibility of more errors, which led the Flash memory industry toward more complex and expensive controllers.

The currently available technologies and products use standard error correcting methods (Reed-Solomon, TCM and more recently LDPC, etc.) together with repetitive memory access, but those solutions are complex, require a substantial amount of processing, and can be significantly slower due to the need for repetitive access.

SUMMARY OF THE INVENTION

A method for writing information to a K-level memory unit, the method may include: receiving a sequence of information bits; generating an information value that represents the sequence of information bits; applying a first function to the information value, to provide a first function result; selecting a first cell of the K-level memory unit as a current cell; wherein K is a positive integer that is greater than 1; writing the first function result to the first cell; and repeating the stages of: (a) reading a current cell to provide a current read result; (b) applying a second function to the current read result and to a function result that was written to the current cell, to provide a second function result; (c) selecting another cell as a current cell; and (d) writing the second function result to the current cell.

A method for reading information from a K-level memory unit, the method may include: repeating the stages of: (i) reading a current cell of the K-level memory unit to provide a reading result of the current cell; wherein K is a positive integer that is greater than 1; (ii) applying a third function that is responsive to the reading result of the current cell for determining a current intermediate derived result; and (iii) selecting another cell as a current cell in response to a cells selection rule; and determining a derived sequence of information bits in response to a last intermediate derived result.

A computer readable medium having a computer readable code embodied therein for writing information to a K-level memory unit, the computer readable code may include instruction for: receiving a sequence of information bits; generating an information value that represents the sequence of information bits; applying a first function to the information value, to provide a first function result; selecting a first cell of the K-level memory unit as a current cell, wherein K is a positive integer that is greater than 1; writing the first function result to the first cell; and repeating the stages of: (a) reading a current cell to provide a current read result; (b) applying a second function to the current read result and to a function result that was written to the current cell, to provide a second function result; (c) selecting another cell as a current cell; and (d) writing the second function result to the current cell.

A computer readable medium having a computer readable code embodied therein for reading information from a K-level memory unit, the computer readable code may include instructions for: repeating the stages of: reading a current cell of the K-level memory unit to provide a reading result of the current cell, wherein K is a positive integer that is greater than 1; applying a third function that is responsive to the reading result of the current cell for determining a current intermediate derived result; and selecting another cell as a current cell in response to the cells selection rule; and for determining a derived sequence of information bits in response to the last intermediate derived result.

A memory controller for writing information to a K-level memory unit, the memory controller includes a first interface for receiving a sequence of information bits; a processor for generating an information value that represents the sequence of information bits; applying a first function to the information value, to provide a first function result; and selecting a first cell of the K-level memory unit as a current cell; and a second interface, coupled to the processor and to the K-level memory unit, for writing function results to cells of the K-level memory unit, and for reading information from cells to provide read results, wherein K is a positive integer that is greater than 1; wherein the memory controller is adapted to write the first function result to the first cell; wherein the second interface and the processor are configured to repeat a following sequence: read, by the second interface, a current cell to provide a current read result and to repetitively write second function result to the current cell; apply, by the processor, a second function to the current read result and to a function result that was written to the current cell to provide a second function result; and select, by the processor, another cell as a current cell.

A memory controller for reading information from a K-level memory unit, the memory controller may include: a second interface to the K-level memory unit; and a processor; wherein the second interface and the processor are configured to repeat a following sequence until providing a last intermediate derived result: read, by the second interface, a current cell of the K-level memory unit to provide a reading result of the current cell; apply, by the processor, a third function that is responsive to the reading result of the current cell for determining a current intermediate derived result; select, by the processor, another cell as a current cell in response to a cells selection rule; wherein the processor is further configured to determine a derived sequence of information bits in response to a last intermediate derived result.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 2B illustrates three stages of the method of FIG. 2A according to an embodiment of the invention;

FIG. 2C illustrates some stages of the method of FIG. 2A, according to an embodiment of the invention; and FIG. 3 is a flow chart of a method for reading information from a K-level memory unit, according to an embodiment of the invention.

Figure 1:
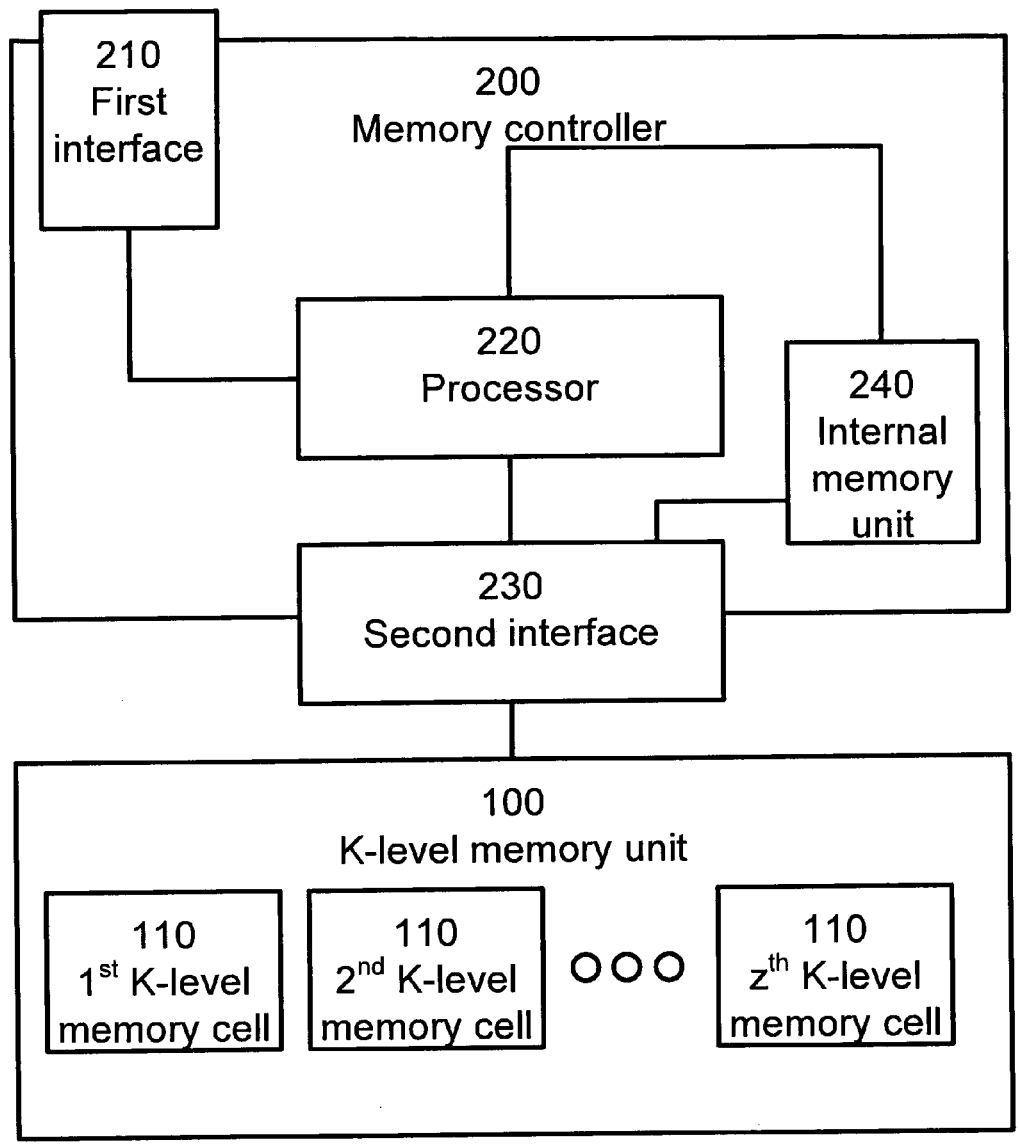
FIG. 1 is an illustration of a memory controller and a K-level memory unit according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The foregoing and other objects, features, and advantages of the present invention will become more apparent from the following detailed description when taken in conjunction with the accompanying drawings. In the drawings, similar reference characters denote similar elements throughout the different views.

FIG. 1 illustrates memory controller 200 and K-level memory unit 100, according to an embodiment of the invention.

The memory controller 200 is adapted to write information to a K-level memory unit 100. The K-level memory unit 100 includes multiple K-level memory cells 110. K is a positive integer that is greater than 1. It may be greater than 2.

Memory controller 200 includes first interface 210, processor 220, second interface 230 and internal memory unit 240. Processor 220 is connected to first interface 210, second interface 230 and to internal memory unit 240. Internal memory unit 240 is also connected to second interface 230.

First interface 210 is for receiving a sequence of information bits. Processor 220 is configured to: (a) generate an information value that represents the sequence of information bits; (b) apply a first function to the information value, to provide a first function result; and (c) select a first cell 110 of the K-level memory unit 100 as a current cell.

Second interface 230 provides as interface to K-level memory unit 100, and is configured to: (a) write function results to cells 110 of K-level memory unit 100, and (b) read information from cells 110 to provide read results.

Memory controller 200 is adapted to: (1) write, by second interface 230, the first function result to the first cell; and to repeat the stages of: (a) reading, by second interface 230, a current cell 110 to provide a current read result; (b) applying, by processor 220, a second function to the current read result and to a function result that was written to the current cell, to provide a second function result; (c) selecting another cell 110 as a current cell; and (d) writing, by second interface 230, the second function result to the current cell.

Accordingly, second interface 230 is configured to repetitively read a current cell 110 to provide a current read result and to repetitively write a second function result to a current cell after the processor has selected another cell as a current cell and calculated the second function result by applying a second function to the current read result and to a function result that was written to the current cell.

FIG. 1 illustrates memory controller 220 as including internal memory unit 240 for storing reading results and so forth.

Memory controller 220 is adapted to carry out method 500 and, additionally or alternatively, carry out method 600 disclosed below. Memory controller 200 is conveniently a fast and cheap controller for flash memory, as will be demonstrated below. The invention facilitates faster access, low complexity and price, and higher capacity.

According to an embodiment of the invention, the K-level memory unit 100 is an analog multi-level memory unit.

According to an embodiment of the invention, processor 220 is adapted to generate the information value to represent the sequence of information bits in a unit interval.

According to an embodiment of the invention, processor 220 is adapted to apply a first function that is an inverse function of a cumulative distribution function (CDF) of an input distribution.

According to an embodiment of the invention, a relation between a function result that was written to the current value and the current read result is governed by a memory unit writing law. The memory unit writing law can be estimated for any specific flash memory unit by repeatedly testing the memory cells.

According to an embodiment of the invention, an input distribution is selected in response to memory unit 100 writing law.

According to an embodiment of the invention, processor 220 is adapted to carry out the repeated stages of applying the second function to the current read result and to the function result that was written to the current cell to provide the second function result by applying the second function that is a composition function of an inverse function of a cumulative distribution function (CDF) of an input distribution, which is applied to a cumulative distribution function (CDF) of an inverted memory unit writing law.

According to an embodiment of the invention, processor 220 is adapted to update the inversed memory unit writing law by: (i) writing an estimation input to a selected cell, (ii) reading the selected cell to provide a reading result, and (iii) storing a writing operation result that is responsive to the estimation input and to the reading result; and updating the inversed memory unit writing law in response to the writing operation results.

According to an embodiment of the invention, processor 220 is adapted to repeat stages (a)-(d) for M−1 cycles, and to determine M so that a ratio between a number of bits of the sequence of information bits to M approximates a mutual information that is induced by a utilized input distribution over a memory unit writing law.

According to an embodiment of the invention, processor 220 is adapted to select other cells in response to a cells selection rule, and wherein memory controller is adapted to retrieve reading results from cells selected according to the cells selection rule, and processor 220 is adapted to determine a derived sequence of information bits in response to multiple reading results.

According to an embodiment of the invention, memory controller 200 is adapted to repeat the stages of: (i) reading, by second interface 230, a current cell to provide a reading result of the current cell; and (ii) selecting, by processor 220, another cell as a current cell in response to the cells selection rule; wherein an order of the cells selected during the retrieving equals an order of the cells selected for the writing of the second function results.

According to an embodiment of the invention, processor 220 is configured to apply, following each reading of a current cell, a third function to: (i) the reading result of the current cell, (ii) a previous intermediate derived result, and (iii) memory unit 100 writing law, for determining a current intermediate derived result; wherein the derived sequence of information bits is responsive to a last intermediate derived result.

According to an embodiment of the invention, the derived sequence of information bits is identical to the sequence of information bits.

Figure 2A:
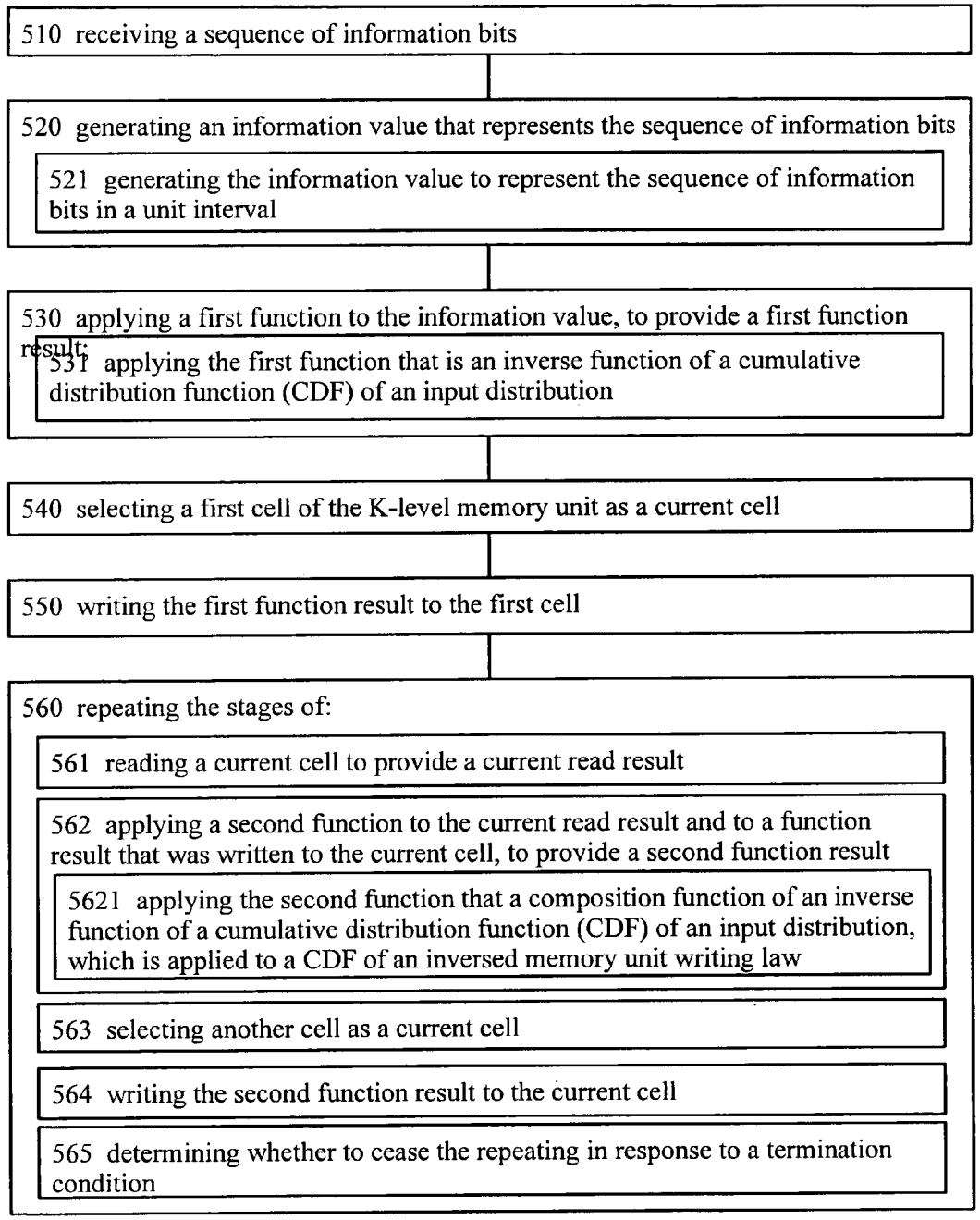
FIG. 2A is a flow chart of a method for writing information to a K-level memory unit, according to an embodiment of the invention.

FIG. 2A is a flow chart of method 500 for writing information to a K-level memory unit, according to an embodiment of the invention.

It is noted that conveniently, method 500 is carried out by a memory controller (such as memory controller 200). Conveniently, method 500 enables a simple and fast procedure of writing information to the K-level memory unit, for achieving a high capacity of the memory unit. K is a positive integer that is greater than (or equal to) 2.

It is further noted that method 500 could be implemented for discrete levels memory cells (e.g. having four levels) or to an analog multi-level memory unit (either taking K->∞, or considering a feasible amount of levels that may be used in practice).

Conveniently, method 500 starts with stage 510 of receiving a sequence of information bits. It is noted that the sequence of information bits is usually a basic information storage unit (e.g. 8 bits of a byte of information that is transmitted to a memory controller for writing to a memory, or 16 bytes of information transmitted together as a batch, and so forth). It is further noted that while discussed in relation to binary bits, method 500 could also be applied for other forms of received information, mutatis mutandis.

According to an embodiment of the invention, stage 510 is followed by stage 520 of generating an information value that represents the sequence of information bits. It is noted that the information value may also be referred to as a message point.

According to an embodiment of the invention, stage 520 includes stage 521 of generating the information value to represent the sequence of information bits in a unit interval. That is, the information value may represent a given point over the unit interval (0,1), that corresponds to the sequence of information bits, wherein the transformation between the two may be by a binary expansion or other.

Method 500 continues with stage 530 of applying a first function to the information value to provide a first function result. It is noted that both the first function and the second function discussed below are used for determining the values that should be written into K-level memory cells of the memory unit.

Thus, stage 530 is followed by stage 540 of selecting a first cell of the K-level memory unit as a current cell, and by stage 550 of writing the first function result to the first cell.

According to an embodiment of the invention, the applying of the first function to the information value to provide the first function result includes stage 531 of applying the first function that is an inverse function of a cumulative distribution function (CDF) of an input distribution.

Specifically, the first function is $F_q^{-1}(A)$, wherein $F_q$ is the cumulative distribution function (CDF) of an input distribution q(x), and where the argument A is the information value.

Once the first function result was written to the first cell, in stage 560 other values are written to additional cells, in a consecutive order. It is clear to a person who is skilled in the art that while the memory controller 200 (or other system) that writes to the memory cells of the K-level memory unit may attempt to write a certain value to a certain cell, the writing may be faulty, and other value will be written instead.

However, the reading of information from the cells of the K-levels memory unit is much less prone to error, and thus the results of the readings from the K-levels memory cells may be considered as effectively error free for the process of method 500. It is noted that a negligible amount of errors that may still occur in the reading and which may result to a negligible amount of erroneous results may be solved in another layer of coding.

Thus, the link between the memory controller and the K-level memory unit may be regarded as a noisy forward channel (the writing to the memory cells, in which errors may occur) with an almost perfect feedback (the reading). Thus, a novel sequential transmission scheme using feedback may be utilized, according to the teaching of the invention, instead of complex forward error correcting codes together with repetitive memory access that are traditionally used in the prior art.

It is noted that method 500 usually attains at least the same performances of the prior art methods, with the added values of rate adaptation, faster access time and robustness to a noise model mismatch, enabling an optimal use of the storage medium.

Stage 550 is thus followed by stage 560 of repeating stages 561 of 564 for one or more cycles.

Stage 561 includes reading a current cell to provide a current read result.

Stage 562 includes applying a second function to the current read result and to a function result that was written to the current cell, to provide a second function result.

Stage 563 includes selecting another cell as a current cell.

Stage 564 includes writing the second function result to the current cell.

It is noted that the writing of stage 560 is sequential, by having the value (second function result) that is written in each of writing operations in a stage 564 depending on a previous second function result—i.e. to the value that was attempted to be written to the previous cell, and to the value that was actually written (current read result).

However, in each cycle of the stages 561-564, the dependency is only on the previous cycle, thus making the calculation very simple in comparison with prior art methods.

Additionally, each cycle conveniently makes the information that is available in the cells already written more accurate, by providing only the information that is still unclear during the reading and decoding process (which will be discussed below). This is enabled because the decoding algorithm is known both during the encoding (writing by the memory controller) and during the decoding (reading from the memory unit by a memory controller), and by having the errors made in each cycle known during the writing process, before writing the next value of information.

To this end, it is noted that according to an embodiment of the invention, stage 562 includes stage 5621 of applying the second function that is a composition function of an inverse function of a cumulative distribution function (CDF) of an input distribution, which is applied to a cumulative distribution function (CDF) of an inversed memory unit writing law.

That is, where x denotes a value to be written (a function result) and where y denotes a value that was actually written for the given x (i.e. the read result), that during the writing to the multi-level memory cell, the writing to the $(n+1)_{th}$ cell of a value $x_{n+1}$ which is equal to $F_q^{-1}(F(x_n|y_n))$, wherein $F(x|y)$ is the cumulative distribution function (CDF) of an inversed memory unit writing law $f(x|y)$ (a probability density function). The value actually written to the (n+1)th cell, or alternatively the read result from that same cell (these are assumed to be practically equal), is $y_{n+1}$. It should be noted that while y and any $y_n$ are considered K-level discrete, x and any $x_n$ are considered continuous values, or at least practically having a resolution that is of the order of the information value A.

That is, the conditional probability of writing a y while attempting to write an x to a memory cell is given by p(y|x) in the memory unit writing law (which usually depends on physical characteristics of the memory unit, and may also depend on external factors such as temperature etc.)

That is, according to an embodiment of the invention, a relation between a function result that was written to the current value and the current read result is governed by a memory unit writing law.

It is noted that the input distribution (denoted above q(x)) may be selected to be a capacity achieving distribution under some desirable input constraint (e.g. by selecting voltages level used for the writing, etc.), or for any other end. According to an embodiment of the invention, method 500 further includes stage 501 (illustrated in FIG. 2B) of selecting an input distribution in response to the memory unit writing law.

It is further noted that the accuracy of decoding of the information that is stored in the cells written to may be assessed during the writing process, because of the feedback mechanism of being able to accurately read the value stored in each cell (even if the value is not the value intended to be written originally). Thus, during the writing the memory controller is usually able to assess the accuracy of the information that may be read (i.e. will a future reader will be able to accurately retrieve the sequence of information bits). This assessment may be carried out in each cycle of stage 560.

Therefore, according to an embodiment of the invention, stage 560 further includes stage 565 of determining whether to cease the repeating in response to a termination condition (which may be carried out prior to the writing of stage 564, and even prior to the applying of the second function in stage 562).

It is however noted that the termination condition have to be responsive to all of the values that were read from all the cells written to, and thus makes the writing process more complex. Additionally, the reading process may require reading different numbers of cells each time, thus potentially complicating the reading process as well. It is noted that, alternatively, the number of cycles (denoted M−1) may be determined in advance, e.g. in response to the memory unit writing law.

Thus, according to an embodiment of the invention, stage 560 includes repeating for M−1 cycles, and wherein the method further includes stage 503 (illustrated in FIG. 2B) of determining M so that a ratio between a number of bits of the sequence of information bits to M approximates a mutual information [I(X;Y)] that is induced by a utilized input distribution q(x) over a memory unit writing law p(y|x).

This means that (approximately) N/M=I(X;Y), thereby giving us the value of M to be used. It is noted that other values of M may be used as well, and that M may be determined in advance (e.g. during manufacture, or at any intermediate time).

As noted above, the memory unit may be affected from external physical conditions, may age with time, or be subject to other changing condition that would change the properties of the memory cells (thus changing the memory unit writing law). Additionally, the memory controller may not include information in relation to a specific memory unit, and may need to adapt itself to it.

Therefore, according to an embodiment of the invention, method 500 further includes stage 502 (illustrated in FIG. 2B) of updating (which may also include generating) the inversed memory unit writing law (which may be stored by way of a matrix, or elsewhere). It is noted that the updating may also be applied for the memory unit writing law, as each of those two writing laws may be uniquely derived from the other.

The updating of stage 502 includes repeating the stages of: (i) writing an estimation input to a selected cell, (ii) reading the selected cell to provide a reading result, and (iii) storing a writing operation result that is responsive to the estimation input and to the reading result; and updating the inversed memory unit writing law in response to the writing operation results.

By way of example, it is noted that if the noise is an additive white Gaussian noise (AWGN), then the scheme becomes extremely simple and each input is a constant linear combination of the previous input and output.

In the discrete setting (i.e., discrete multi-level memory unit) there is also a universal version for our scheme, and the "empirical capacity" of the memory can be attained without even knowing it in advance. That is, the noise can be arbitrary but still the performance of our scheme will be as if its empirical statistics were known in advance. This is achieved by sequentially estimating the "channel" of writing via a random training sequence written to the memory unit, and constantly adapting the memory unit writing law p(y|x). The universal scheme can be considered as another (although related) invention.

Taking stages 510 through 560 of method 500 as a whole, it is noted that this writing of information responsive to the sequence of information bits may be reiterated for multiple sequence of information bits.

FIG. 2B illustrates three stages 501, 502, and 503, each of which may be part of method 500 (usually carried out prior to stage 510).

FIG. 2C is a flowchart that continues the flow chart of FIG. 2A, according to an embodiment of the invention. While the reading process may be carried out independently (and even by another memory controller), it may also be a part of method 500. FIG. 2C illustrates the reading process, according to an embodiment of the invention.

Considering the writing process, it is noted that the cells selected in stage 563 are usually selected in response to a cells selection rule that defines an order of selection. The cells may be physically adjacent to each other, but this is not necessarily so.

According to an embodiment of the invention, method 500 further includes stage 570 of retrieving reading results from cells selected according to the cells selection rule, and stage 580 of determining a derived sequence of information bits in response to multiple reading results. It is noted that the derived sequence of information bits should be identical to the sequence of information bits received in stage 510, unless an error did unfortunately occur in one of the reading operations.

According to an embodiment of the invention, stage 570 includes repeating stages 571 and 573.

Stage 571 includes reading a current cell to provide a reading result of the current cell (it is noted that the current cell of stage 570 are generally not the same as those of stage 560.

Stage 572 includes selecting another cell as a current cell in response to the cells selection rule; wherein an order of the cells selected during the retrieving equals an order of the cells selected for the writing of the second function results.

According to an embodiment of the invention, stage 570 further includes stage 572, wherein each reading of a current cell (stage 571) is followed by stage 572 of applying of a third function to: (i) the reading result of the current cell, (ii) a previous intermediate derived result, and (iii) the memory unit writing law, for determining a current intermediate derived result; wherein the derived sequence of information bits is responsive to a last intermediate derived result.

When reading back from memory, the controller simply reads the M cells sequentially, and builds a posterior probability density function (PDF) $f_M(a)=f_{A|Y1,Y2,\ldots,YM}(a|y_1, y_2, \ldots, y_M)$ for acquiring the derived sequence of information bits. The memory controller is now able to determine the most likely sequence of information bits embodied in the information value A, with a bit-rate that can correspond to the mutual information, and with very low error probability. It is noted that for every number of read results lesser then M, an intermediate derived result is acquired.

According to the embodiment of the invention mentioned in relation to stage 572, the posterior is also built recursively, and is given by $f_{n+1}(a)=f_{A|Y1,Y2,\ldots,Yn+1}(a|y_1,y_2,\ldots,y_{n+1})=f_n(a)*p(y_{n+1}|x_{n+1})/p(y_{n+1})$. Then the memory controller is able to decode N bits that correspond to a binary interval that has a maximal a-posteriori probability under $f_M(a)$, and contains the information value A with probability close to 1.

Stage 572 can also include not only deriving an intermediate result for the information value, but also updating and storing the intermediate posterior distribution. The "intermediate derived result" can also include the current a-posteriori distribution of the information value A given the sequence of readings so far.

At each time point, stage 570 includes, according to an embodiment of the invention, calculating the a-posteriori density function of the current intermediate derived result $f_n(a)=f_{A|Y1,Y2,\ldots,Yn}(a|y_1,y_2,\ldots,y_n)$, starting with $f_0(a)$ uniform over the unit interval. The selection of first, second and third functions is to result in a fast concentration of the posterior around the true information value A, rapidly reducing the uncertainty during the reading process and allowing a reliable reconstruction of the derived sequence of information bits at an appropriate rate.

The determining of stage 580 conveniently includes calculating an a-posteriori probability distribution of the current intermediate derived result position over the unit interval given all the reading results of the cells accessed so far, and finding a (small) interval with a-posteriori probability arbitrarily close to 1, which thereby includes the information value A with the same very high probability. The sequence of information bits is then derived from the binary representation of that small interval.

It is noted that conveniently, the derived sequence of information bits is identical to the sequence of information bits, with probability arbitrarily close to 1.

FIG. 3 illustrates method 600 for reading information from a K-level memory unit (wherein K is a positive integer that is greater than 1), according to an embodiment of the invention.

It is noted that method 600 may be carried out by the same memory controller or by another memory reading system.

Method 600 starts with stage 610 of repeating stages 611, 612 and 613.

Stage 611 includes reading a current cell to provide a reading result of the current cell.

Stage 612 includes applying a third function that is responsive to the reading result of the current cell for determining a current intermediate derived result; and Stage 613 includes selecting another cell as a current cell in response to the cells selection rule.

According to an embodiment of the invention, the applying of the third function includes stage 6121 of applying the third function to: (i) the reading result of the current cell, (ii) a previous intermediate derived result, and (iii) the memory unit writing law, for determining a current intermediate derived result.

Stage 610 is followed by stage 620 of determining a derived sequence of information bits in response to the last intermediate derived result.

According to an embodiment of the invention, the K-level memory unit is an analog multi-level memory unit.

According to an embodiment of the invention, the intermediate derived results represent sequences of information bits in a unit interval.

It is noted that method 600 generally corresponds to stages 570 and 580 of method 500, and to variations thereof.

Figure 4:
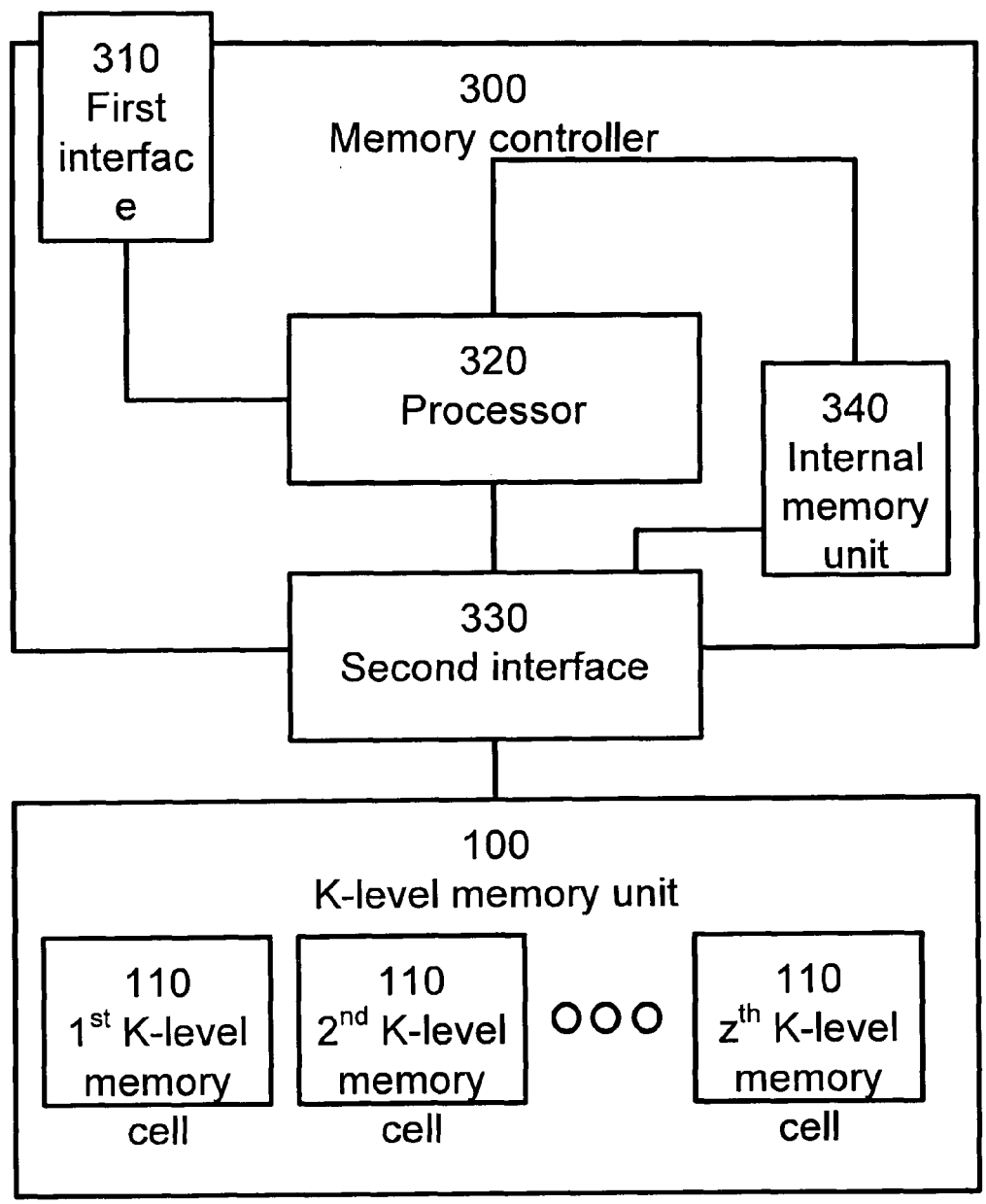
FIG. 4 is an illustration of a memory controller and a K-level memory unit according to an embodiment of the invention.

FIG. 4 illustrates memory controller 300 for reading information from K-level memory unit 100, according to an embodiment of the invention.

Memory controller 300 includes second interface 330 to the K-level memory unit 100 (K is a positive integer that is greater than 1) and a processor 320 connected to each other (and may also include internal memory unit 340 and first interface 310 for providing sequences of information bits).

Memory controller 300 is adapted to repeat the stages of:

(a) Reading, by second interface 330, a current cell 110 of the K-level memory unit 100 to provide a reading result of the current cell 110.

(b) Applying, by processor 320, a third function that is responsive to the reading result of the current cell for determining a current intermediate derived result; and (c) Selecting, by processor 320, another cell 110 as a current cell 110 in response to the cells selection rule.

Processor 320 is further for determining a derived sequence of information bits in response to the last intermediate derived result.

According to an embodiment of the invention, wherein K-level memory unit 100 is an analog multi-level memory unit.

According to an embodiment of the invention, the intermediate derived results represent sequences of information bits in a unit interval.

According to an embodiment of the invention, processor 320 is further for applying the third function by applying the third function to: (i) the reading result of the current cell, (ii) a previous intermediate derived result, and (iii) the memory unit writing law, for determining a current intermediate derived result.

According to an embodiment of the invention, a first computer readable medium is disclosed, having first computer readable code embodied therein for writing information to a K-level memory unit, the first computer readable code includes instruction for: receiving a sequence of information bits; generating an information value that represents the sequence of information bits; applying a first function to the information value, to provide a first function result; selecting a first cell of the K-level memory unit as a current cell; writing the first function result to the first cell; and repeating the stages of: (a) reading a current cell to provide a current read result; (b) applying a second function to the current read result and to a function result that was written to the current cell, to provide a second function result; (c) selecting another cell as a current cell; and (d) writing the second function result to the current cell; wherein K is a positive integer that is greater than 1.

According to an embodiment of the invention, the K-level memory unit is an analog multi-level memory unit.

According to an embodiment of the invention, the generating includes generating the information value to represent the sequence of information bits in a unit interval.

According to an embodiment of the invention, the applying of the first function to the information value to provide the first function result includes applying the first function that is an inverse function of a cumulative distribution function (CDF) of an input distribution.

According to an embodiment of the invention, a relation between a function result that was written to the current value and the current read result is governed by a memory unit writing law.

According to an embodiment of the invention, an input distribution is selected in response to the memory unit writing law.

According to an embodiment of the invention, the repeated stage of applying the second function to the current read result and to the function result that was written to the current cell to provide the second function result includes: applying the second function that is a composition function of an inverse function of a cumulative distribution function (CDF) of an input distribution, which is applied to a cumulative distribution function (CDF) of an inversed memory unit writing law.

According to an embodiment of the invention, comprising instructions for updating the inversed memory unit writing law, wherein the updating includes: repeating the stages of: (i) writing an estimation input to a selected cell, (ii) reading the selected cell to provide a reading result, and (iii) storing a writing operation result that is responsive to the estimation input and to the reading result; and updating the inversed memory unit writing law in response to the writing operation results.

According to an embodiment of the invention, the repeating includes repeating for M−1 cycles, wherein the first computer readable code further includes instructions for determining M so that a ratio between a number of bits of the sequence of information bits to M approximates a mutual information that is induced by a utilized input distribution over a memory unit writing law.

According to an embodiment of the invention, the selecting of the another cells is responsive to a cells selection rule, and wherein the first computer readable code further includes instructions for retrieving reading results from cells selected according to the cells selection rule, and determining a derived sequence of information bits in response to multiple reading results.

According to an embodiment of the invention, the retrieving includes repeating the stages of: (i) reading a current cell to provide a reading result of the current cell; and (ii) selecting another cell as a current cell in response to the cells selection rule; wherein an order of the cells selected during the retrieving equals an order of the cells selected for the writing of the second function results.

According to an embodiment of the invention, each reading of a current cell is followed by applying of a third function to: (i) the reading result of the current cell, (ii) a previous intermediate derived result, and (iii) the memory unit writing law, for determining a current intermediate derived result; wherein the derived sequence of information bits is responsive to a last intermediate derived result.

According to an embodiment of the invention, the derived sequence of information bits is identical to the sequence of information bits, with probability arbitrarily close to 1 (for increasing values of M and N)

According to an aspect of the invention, a second computer readable medium is disclosed, having second computer readable code embodied therein for reading information from a K-level memory unit, the second computer readable code includes instruction for: repeating the stages of: (i) reading a current cell to provide a reading result of the current cell; (ii); applying a third function that is responsive to the reading result of the current cell for determining a current intermediate derived result; and (iii) selecting another cell as a current cell in response to the cells selection rule; and determining a derived sequence of information bits in response to the last intermediate derived result; wherein K is a positive integer that is greater than 1.

According to an embodiment of the invention, the K-level memory unit is an analog multi-level memory unit.

According to an embodiment of the invention, the intermediate derived results represent sequences of information bits in a unit interval.

According to an embodiment of the invention, the applying of the third function includes applying the third function to: (i) the reading result of the current cell, (ii) a previous intermediate derived result, and (iii) the memory unit writing law, for determining a current intermediate derived result.

The mentioned above method and apparatus are characterized by reduced complexity and costs, increased capacity and adaptation, faster access time.

The mentioned above apparatus and method can be simple and sequential, as opposed to the complicated forward error correction schemes that are commonly used in multi-level and analog memories. Accordingly, the mentioned above apparatus and method is expected to be less complex and much cheaper.

The mentioned above apparatus and method are robust to noise model mismatch, and can also adapt itself to attain the empirical capacity. They can be characterized by better usage of the storage medium.

Conveniently, the repetitive reading/writing approach "improves" the channel (and increase its capacity) at the cost of reducing the access time. This can be automatically incorporated into our scheme, hence enabling us to trade access time with memory if desired.

The present invention can be practiced by employing conventional tools, methodology and components. Accordingly, the details of such tools, component and methodology are not set forth herein in detail. In the previous descriptions, numerous specific details are set forth, in order to provide a thorough understanding of the present invention. However, it should be recognized that the present invention might be practiced without resorting to the details specifically set forth.

Only exemplary embodiments of the present invention and but a few examples of its versatility are shown and described in the present disclosure. It is to be understood that the present invention is capable of use in various other combinations and environments and is capable of changes or modifications within the scope of the inventive concept as expressed herein.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method for writing information to a K-level memory unit, the method comprises:
   receiving a sequence of information bits;
   generating an information value that represents the sequence of information bits;
   applying a first function to the information value, to provide a first function result;
   selecting a first cell of the K-level memory unit as a current cell; wherein K is a positive integer that is greater than 2;
   writing the first function result to the first cell;
   repeating the stages of:
      (a) reading a current cell to provide a current read result;
      (b) applying a second function to the current read result and to a function result that was written to the current cell, to provide a second function result;
      (c) selecting another cell as a current cell; and
      (d) writing the second function result to the current cell;
   applying a second function that is a composition function of an inverse function of a cumulative distribution function (CDF) of an input distribution, which is applied to a cumulative distribution function (CDF) of an inversed memory unit writing law; and
   updating the inversed memory unit writing law, wherein the updating comprises: repeating the stages of: (i) writing an estimation input to a selected cell, (ii) reading the selected cell to provide a reading result, and (iii) storing a writing operation result that is responsive to the estimation input and to the reading result; and
   updating the inversed memory unit writing law in response to the writing operation results.

2. The method of claim 1, wherein the K-level memory unit is an analog multi-level memory unit.

3. The method of claim 1, comprising generating the information value to represent the sequence of information bits in a unit interval.

4. The method of claim 1, wherein the first function is an inverse function of a cumulative distribution function (CDF) of an input distribution.

5. The method of claim 1, wherein a relation between a function result that was written to the current value and the current read result is governed by a memory unit writing law.

6. The method of claim 5, comprising selecting an input distribution based on to the memory unit writing law.

7. A method for writing information to a K-level memory unit, the method comprises:
   receiving a sequence of information bits;
   generating an information value that represents the sequence of information bits;
   applying a first function to the information value, to provide a first function result;
   selecting a first cell of the K-level memory unit as a current cell; wherein K is a positive integer that is greater than 2;
   writing the first function result to the first cell;
   repeating the stages of:
      (a) reading a current cell to provide a current read result;
      (b) applying a second function to the current read result and to a function result that was written to the current cell, to provide a second function result;
      (c) selecting another cell as a current cell; and
      (d) writing the second function result to the current cell,
   wherein the repeating comprises repeating for M−1 cycles, wherein the method further comprises determining M so that a ratio between a number of bits of the sequence of information bits to M approximates a mutual information that is induced by a utilized input distribution over a memory unit writing law.

8. A method for writing information to a K-level memory unit, the method comprises:
   receiving a sequence of information bits;
   generating an information value that represents the sequence of information bits;
   applying a first cell of the information value, to provide a first function result;
   selecting a first cell of the K-level memory unit as a current cell; wherein K is a positive integer that is greater than 2;
   writing the first function result to the first cell;
   repeating the stages of:
      (a) reading a current cell to provide a current read result;
      (b) applying a second function to the current read result and to a function result that was written to the current cell, to provide a second function result;
      (c) selecting another cell as a current cell; and
      (d) writing the second function result to the current cell,
   wherein the selecting of another cell is responsive to a cells selection rule, and wherein the method further comprises retrieving reading results from cells selected according to the cells selection rule, and determining a derived sequence of information bits in response to multiple reading results.

9. The method of claim 8, wherein the retrieving comprises repeating the stages of:
   (i) reading a current cell to provide a reading result of the current cell; and
   (ii) selecting another cell as a current cell in response to the cells selection rule;
      wherein an order of the cells selected during the retrieving equals an order of the cells selected for the writing of the second function results.

10. The method of claim 9, wherein each reading of a current cell is followed by applying of a third function to: (i) the reading result of the current cell, (ii) a previous intermediate derived result, and (iii) the memory unit writing law, for determining a current intermediate derived result; wherein the derived sequence of information bits is responsive to a last intermediate derived result.

11. The method of claim 8, wherein the derived sequence of information bits is identical to the sequence of information bits.

* * * * *